United States Patent [19]
Kim et al.

[11] Patent Number: 5,625,221
[45] Date of Patent: Apr. 29, 1997

[54] SEMICONDUCTOR ASSEMBLY FOR A THREE-DIMENSIONAL INTEGRATED CIRCUIT PACKAGE

[75] Inventors: Jae J. Kim, Seoul; Dong K. Kim, Chunan; Seung H. Ahn, Suwon, all of Rep. of Korea

[73] Assignee: Samsung Electronics Co., Ltd., Suwon, Rep. of Korea

[21] Appl. No.: 368,165

[22] Filed: Jan. 3, 1995

[30] Foreign Application Priority Data

Mar. 3, 1994 [KR] Rep. of Korea ............... 94-4282

[51] Int. Cl.$^6$ ................ H01L 23/02; H01L 23/34
[52] U.S. Cl. ................ 257/686; 257/685; 257/723
[58] Field of Search .................. 257/678, 686, 257/685, 691, 692, 696, 723, 777

[56] References Cited

U.S. PATENT DOCUMENTS

| | | |
|---|---|---|
| 5,105,261 | 4/1992 | Ueda et al. . |
| 5,343,075 | 8/1994 | Nishino ............... 257/686 |
| 5,377,077 | 12/1994 | Burns . |

FOREIGN PATENT DOCUMENTS

| | | | |
|---|---|---|---|
| 58-11047 | 8/1984 | Japan | 257/686 |
| 62-118466 | 11/1988 | Japan | 257/696 |

OTHER PUBLICATIONS

Company Description, TechSearch International, Inc., 1993.

*Primary Examiner*—Carl Whitehead, Jr.
*Attorney, Agent, or Firm*—Cushman Darby & Cushman IP Group of Pillsbury Madison & Sutro LLP

[57] ABSTRACT

A semiconductor package assembly includes recessed edge portions extending along at least one edge portion of the assembly and an upper surface of leads being exposed therefrom, a top recess portion disposed on a top surface of the assembly, and a bottom recess portion disposed on a bottom surface of the assembly. When the assemblies are used in fabricating a three-dimensional integrated circuit module, the recessed edge portions accommodates leads belonging to an upper semiconductor assembly to achieve electrical interconnection therebetween, the top recess portion and the bottom recess portion belonging to an upper semiconductor assembly form a space to accommodate a heat sink or a capacitor plate.

12 Claims, 9 Drawing Sheets

FIG. 3
PRIOR ART
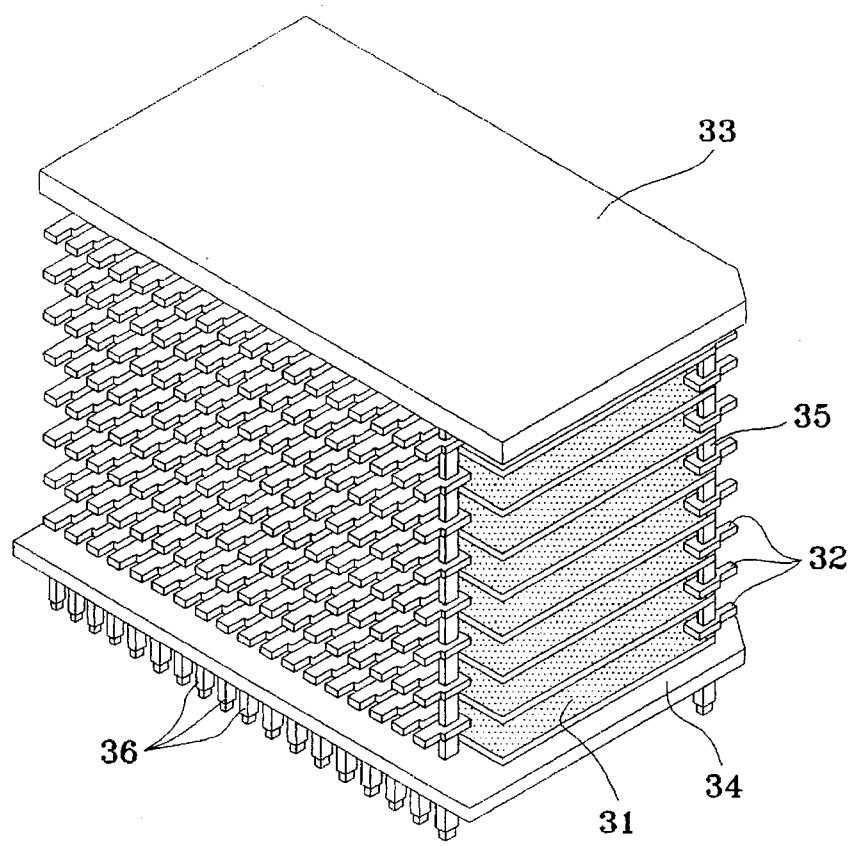
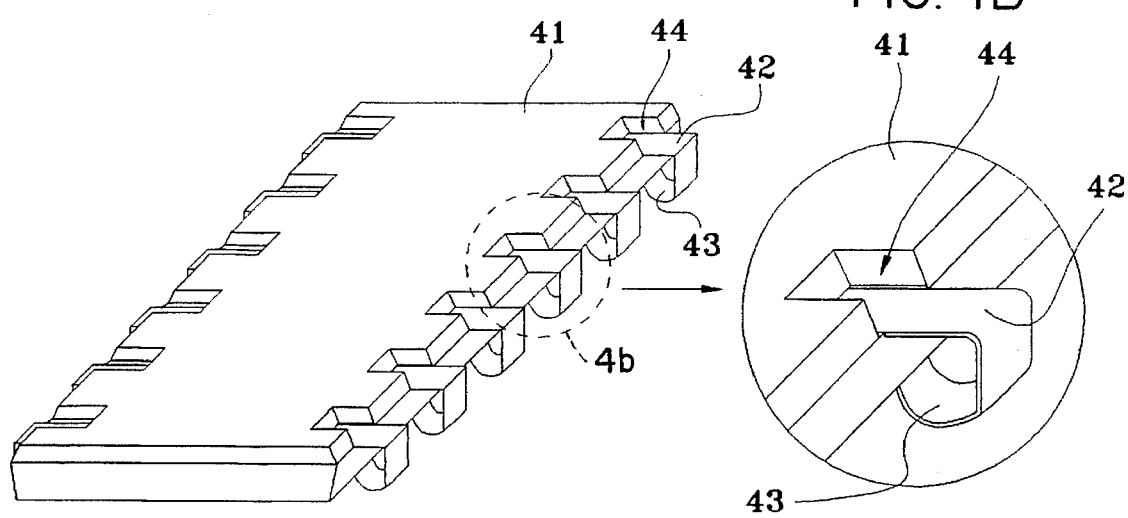
FIG. 4A
FIG. 4B

FIG. 10
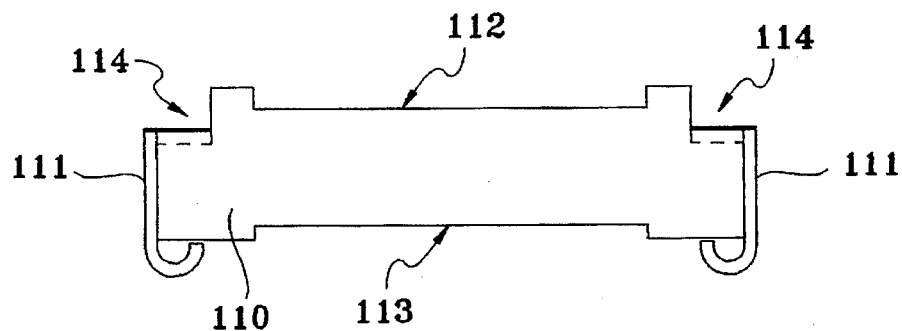
FIG. 11A  FIG. 11B
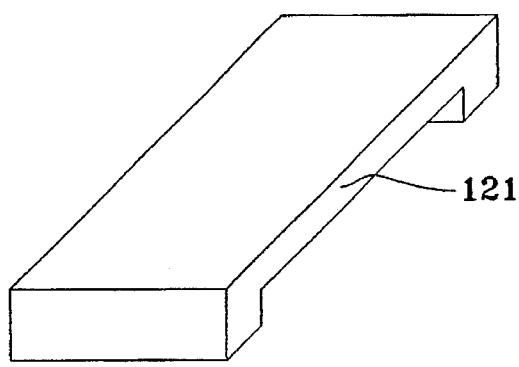 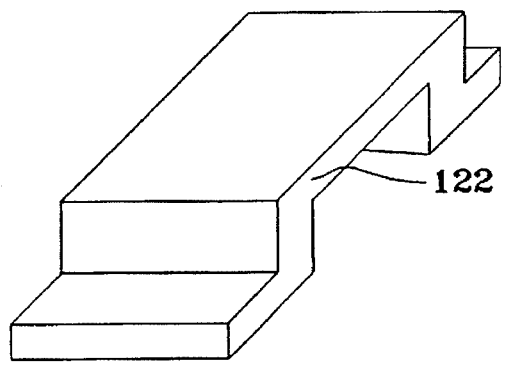
FIG. 12
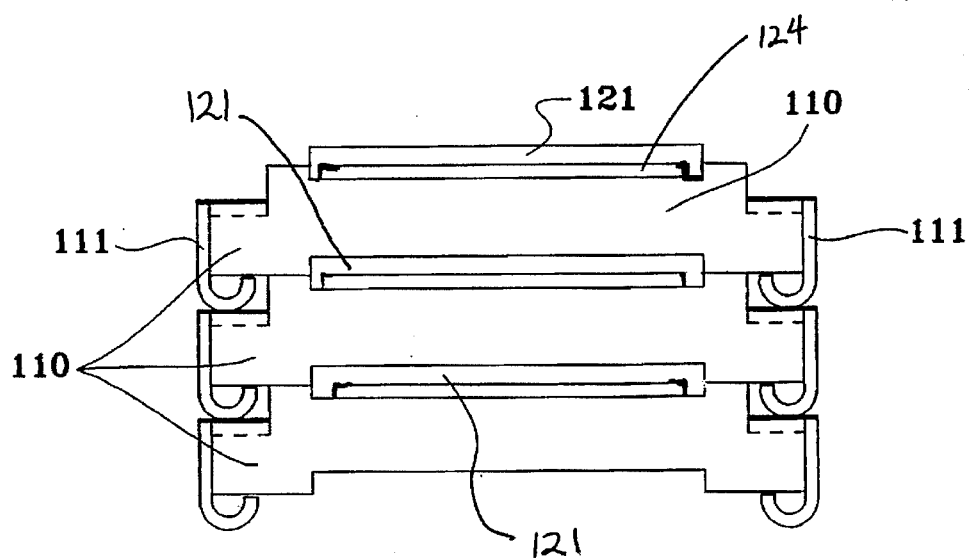

SEMICONDUCTOR ASSEMBLY FOR A THREE-DIMENSIONAL INTEGRATED CIRCUIT PACKAGE

BACKGROUND OF THE INVENTION

1. Field of the Invention

The present invention relates to a semiconductor assembly for an improved three-dimensional integrated circuit structure, and more particularly, to a semiconductor assembly having a stacked module structure employing a heat sink and a capacitor plate.

2. Description of Related Art

Three-dimensional packaging technology has become useful in electronic systems needing larger capacity, faster operating speed, and minimized size. Previously proposed three-dimensional packaging technologies include chip-stacked type and assembly-stacked type. Almost all assembly manufacturers utilize configurations for reducing device size in order to enhance operating speed and to increase capacity. However, the chip-stacked package, when implemented, has low reliability, high cost, and a long developing period. The assembly-stacked package still has disadvantages compared with a two-dimensional packaging configuration. It requires process steps for vertical interconnection in addition to the basic packaging process for a semiconductor assembly. It also requires mounting a heat sink on each semiconductor assembly using an additional process step, or employing a separate cooling device for heat emission. Each heat sink on each assembly increases the volume of the stacked package when implemented and also makes high density packaging impossible. If the cooling device is employed, the cost for manufacturing the assembly-stacked package is increased.

FIG. 1 illustrates a conventional assembly-stacked package disclosed in an article titled "3-D Stacked Memory Devices Using a Proprietary Process" proposed by STAK-TEK CO. Leads 12 protruding from assemblies 11 are electrically connected to a connecter 13 after the assemblies 11 have been stacked atop each other. Then, for heat emission, thin metal foil portions are stacked between the assemblies 11, or, as shown in FIG. 1, a grounded heat sink 14 is formed to cover the overall stacked structure.

However, the formation of the thin metal foil portions and the need for protruding die pad regions at the top of the structure make the fabrication process more complicated. Moreover, the packaging configuration of FIG. 1 is a difficult to use with further structures with a core as a carrier for interconnecting between the assemblies 11. Also, this configuration is not well-suited to mass-production since it is not generally compatible used with existing manufacturing apparatuses.

A technique proposed in U.S. Pat. No. 5,105,261, as illustrated in FIG. 2A, involves a three-dimensional assembly-stacked structure in which bilateral leads 22 protruding from assemblies 21 are folded in a gull-wing shape. The leads 22 are inserted into pin holes 26 on two printed circuit boards 23 that are inserted into connection sockets 25. The folded leads 22, as shown in FIG. 2B, extend through the pin holes 26 and are attached to the printed circuit boards 23 by solder 24. The disclosed device, however, has several topological limitations such that it is difficult to increase the packing density due the height of the device. It is also difficult to increase the number of the assemblies which can be stacked therein. Furthermore, the attaching portions between the assemblies and the printed circuit boards are connected only by the bonding force of the solder, which can be structurally weak.

A single in-line memory module developed by RTB Co., as shown in FIG. 3, includes a plurality of assemblies 31, each having a plurality of leads 32. Each lead 32 has a pin hole connecting the lead 32 to a corresponding vertical lead 36. A plurality of pins 35 extend between a bottom plate 34 and a top plate 33 and pass through the pin holes of leads 32, so that the leads 32 are fixed thereto and supported by the pins 35. The top plate 33 has a plurality of grooves (not shown) to engage the pins 35, which also protrude under the bottom plate 34 for mounting on a printing circuit board (not shown). (Pins 35 are not all shown for clarity.)

In accordance with the conventional single in-line memory module shown in FIG. 3, since the number of pins may increase if the pitch between the leads becomes narrow, it is difficult to mount the module with such thin pins on the printed circuit board without a specific socket for connecting the pins thereto. Furthermore, the vertical interconnection between fine leads and thin pins makes the structure and its fabricating process complicated, thereby limiting packing and stacking capacity.

SUMMARY OF THE INVENTION

Accordingly, it is an object of the present invention to provide a semiconductor assembly for a three-dimensional integrated circuit package which can be greatly advantageous for reducing manufacturing cost.

It is another object of the present invention to provide a semiconductor assembly adaptable to a high density three-dimensional integrated circuit package.

It is still another object of the present invention to provide a semiconductor assembly capable of embodying a three-dimensional integrated circuit package without an additional specific manufacturing process.

Yet another object of the present invention is to provide a semiconductor assembly adaptable to a three-dimensional integrated circuit package with high reliability.

A further object of the present invention is to provide a semiconductor assembly capable of embodying a variety of reliable three-dimensional integrated circuit packages.

A still further object of the present invention is to provide a reliable three-dimensional integrated circuit package without deteriorating the yields of semiconductor assemblies to be mounted thereon.

A yet further object of the present invention is to provide a high density of three-dimensional integrated circuit package advantageously to reduce a cost for manufacturing.

An additional object of the present invention is to provide a method for manufacturing a high reliability integrated circuit package, which is useful for reducing a cost.

A further aspect of the present invention provides a three-dimensional integrated circuit package having a plurality of integrated circuit assemblies, each assembly including recessed portions corresponding to respective leads along at least one edge portion of the assembly, in which a part of each lead is exposed in the recess portion, and at least one capacitor assembly including a recess portion which is extended along at least one edge portion of the capacitor assembly and accommodates the leads therein.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 3 is a perspective view of another conventional stacked module;

FIG. 4A is a perspective view of a semiconductor assembly in accordance with a preferred embodiment of the present invention and FIG. 4B is an enlargement of the portion shown within the dashed line circle in FIG. 4A;

FIG. 10 shows a front elevation view of a semiconductor assembly adapted to use a heat sink according to the present invention;

FIG. 11A is a perspective view of a heat sink in accordance with yet another embodiment of the present invention;

FIG. 11B is a perspective view of a heat sink in accordance with yet another embodiment of the present invention;

FIG. 12 is a schematic sectional view of a stacked module using semiconductor assemblies on which the heat sink shown in FIG. 11A are mounted;

DETAILED DESCRIPTION OF THE PREFERRED EMBODIMENTS

Figure 1:
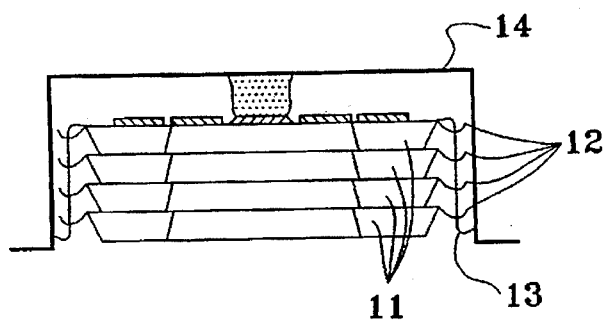
FIG. 1 is a front view of a conventional stacked module.
Figure 2A:
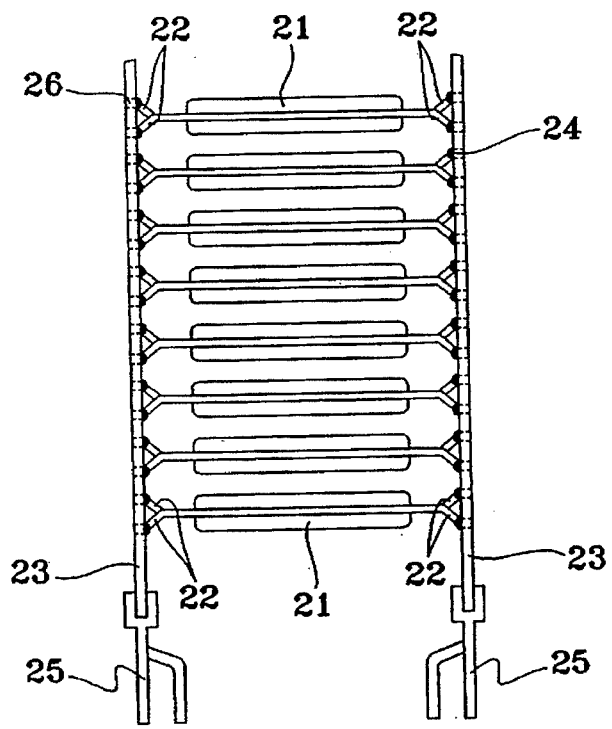
FIGS. 2A and 2B illustrate an overall sectional structure of another conventional stacked module and its semiconductor assembly.
Figure 2B:
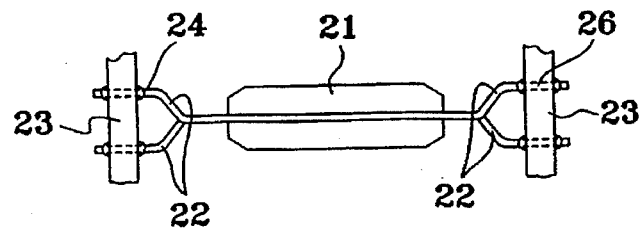

The techniques disclosed in this detailed description of the present invention are by way of example only. It should be clear to one skilled in the art that alternate techniques may be employed within the scope of the contemplated invention.

Further, other techniques which are peripheral to the present invention and are well-known in the art, such as how to attach an integrated circuit to a ceramic substrate, are not disclosed to avoid obscuring the present invention in unnecessary detail. It should be noted, hereinbelow, that "module" means "three-dimensional integrated circuit package".

FIGS. 4A and 4B show a semiconductor chip package assembly in accordance with a first embodiment of the present invention. Referring to FIG. 4, assembly 40 has an assembly body with a plurality of leads extending, in this case, from opposite sides thereof. Each lead has a first lead portion 42 extending generally outwards from the assembly body 41, and a second, bent lead portion 43. The second lead portion as shown in FIGS. 4A and 4B is a J-shaped lead, for example. The assembly body 41 has a plurality of pockets or recessed portions 44 along the edges thereof which correspond to the location of the first lead portions 42. It should be noted that the recessed pockets 44 will receive the bent lead portions of another assembly body stacked thereon.

Though the structure shown in FIGS. 4A and 4B is a dual in-line type, the J-shaped configuration of the leads 43 may be replaced with another form, such as a quad type when applied to QFP structure. The recessed pockets 44 will be provided on four edge portions of the assembly body 41 if applied to the quad type package.

Figure 5:
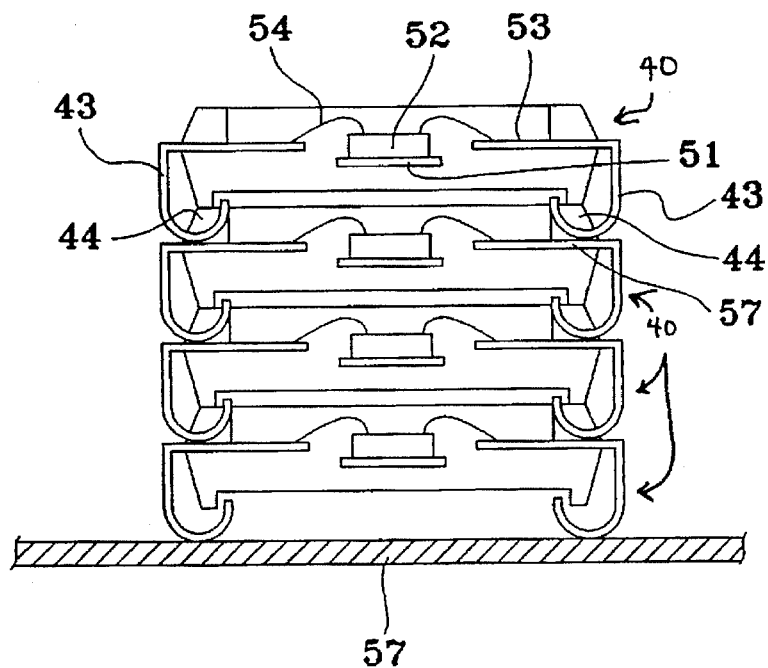
FIG. 5 is a sectional view of a stacked module using the semiconductor assemblies shown in FIGS. 4A and 4B.

In FIG. 5, four (for example) assemblies 40 of the type seen in FIGS. 4A and 4B are vertically stacked on a printed circuit board 57 to form a module. Within each assembly 40, first lead portions 42 are connected to corresponding pads of an integrated circuit chip 52 via bonding wires 54. The integrated circuit chip 52 is mounted on a die pad 51. The J-shaped lead portions 43 of an upper assembly 40 are accommodated into the recessed pockets 44 of a lower assembly to establish electrical interconnection therebetween. The second lead portions 43 may then be fixed to one another, for example, by means of a well-known soldering reflow process.

It should be noted that the recessed pockets 44 are used as alignment structures to obtain a successful electrical interconnection between respective upper and lower assemblies and also to provide structural stabilization and support. The vertical height of second lead portions 43 may be adjusted by a bending tool in accordance with the structural requirements involved in adjacent assemblies.

As an example, when the height of a respective assembly 40 is 3 mm, excluding the stand-off height, and the remaining length of the pocket 44 is 0.7 mm, the separation distance between the underside of the J-shaped portion 43 of an upper lead and the face of a lower lead portion 42 which is exposed within a pocket 44 may be about 1 mm. This distance can be compensated for by extending the length of the upper lead by about 1 mm.

In the case of a TSOJ (Thin and Small Out-line J-shape) assembly formed with a larger stand-off thickness than that of the SOJ configuration, the length of the leads may be shorter, so the folded position of the leads will be higher than shown in FIG. 5.

Figure 6:
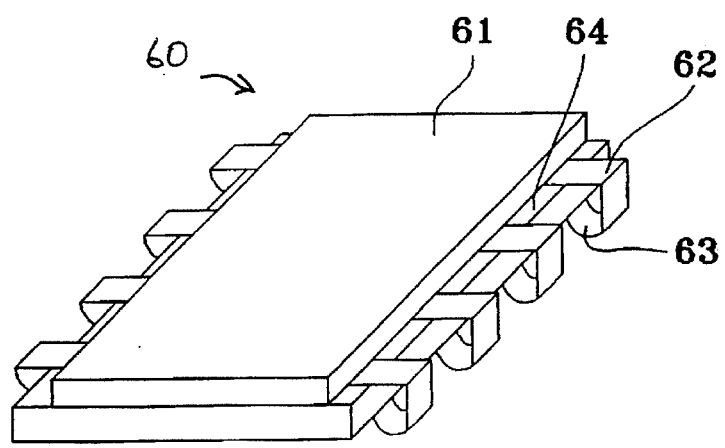
FIG. 6 is a perspective view of a semiconductor assembly in accordance with another embodiment of the present invention.

FIG. 6 shows a semiconductor assembly 60 in accordance with a second embodiment of the present invention. The assembly 60 shown in FIG. 6 is useful for the TSOJ package, in which continuous recessed, or stepped, portions 64 are provided along continuous edge portions of assembly body 61 and J-shaped lead portions 63 are on the recessed portions 64.

Though the structure shown in FIG. 6 relates to a dual in-line type assembly, it may be altered into another form, such as the QFP structure. The recessed portions 64 will be disposed on four edge portions of the assembly body 61.

Such a structure may be advantageous in an assembly having a smaller pitch between the leads than that of the device shown in FIGS. 4A and 4B.

Figure 7:
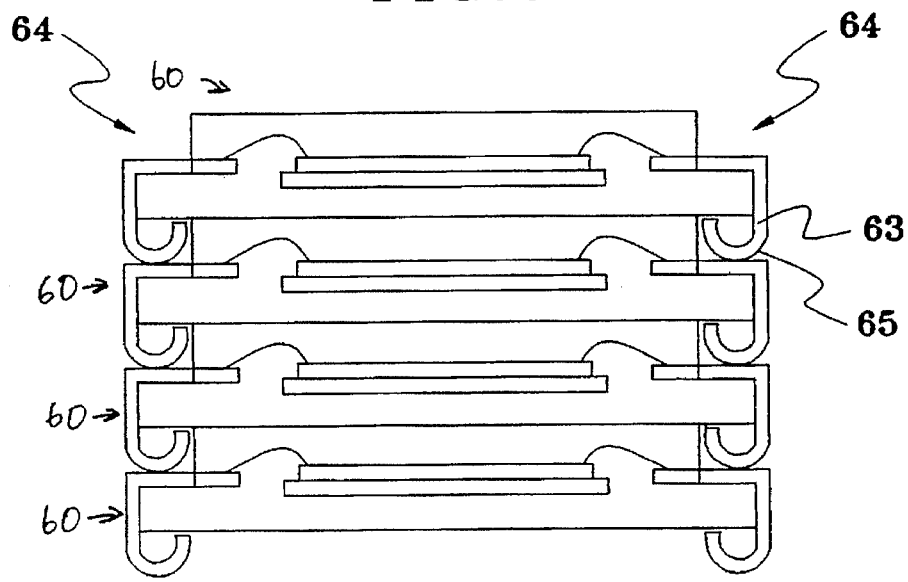
FIG. 7 is a sectional view of a stacked module using the semiconductor assemblies shown in FIG. 6.

In FIG. 7, four assemblies as illustrated in FIG. 6 are vertically stacked on each other on a printed circuit board (not shown) to form a module. The J-shaped lead portions 63 are accommodated within the corresponding recessed portions 64 of a respective lower assembly. The undersides of the J-shaped lead portions 63 are fixed to the corresponding exposed faces of the leads on the recessed portions, for example, by means of a known solder reflow process, so that electrical interconnection between the upper and lower assemblies is obtained.

Figure 8:
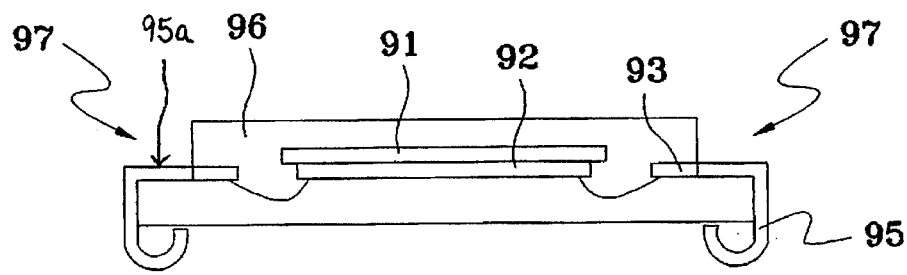
FIG. 8 is a sectional view of a semiconductor assembly in accordance with a still another embodiment of the present invention.

FIG. 8 shows a semiconductor assembly in accordance with another embodiment of the present invention, in which integrated circuit chip 92 is relatively large and is connected to leads 95 through bonding wires 94 by means of a common bonding method. The integrated circuit chip 92 is attached beneath die pad 91 of this instance. The assembly body 96 is composed of epoxy molding compound, for example. Leads 95 extend from recessed portions 97 provided along the edges of assembly body so that upper parts 95a of the leads are exposed.

Figure 9:
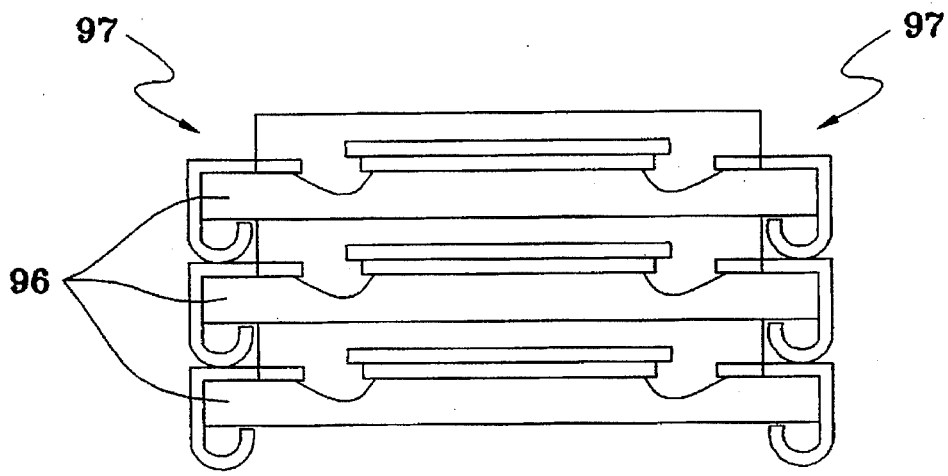
FIG. 9 is a sectional view of a stacked module using the semiconductor assemblies shown in FIG. 8.

Three assemblies (for example) with a sectional configuration like in FIG. 8 are stacked on each other, as shown FIG. 9, to form a module on a printed circuit board (not shown). The stacked structure of FIG. 9 is generally the same as that of FIG. 7.

FIG. 10 is an external view of a semiconductor assembly adapted to use a heat sink along with the basic structure shown in FIG. 4 or FIG. 6, in which top and bottom recess portions 112 and 113 and recessed edge portions 114 are included therein. Leads 111 adjacent to the recessed edge portions 114 are buried into the molding compound, as illustrated by the broken lines in FIG. 10, with a portion of leads 111 being exposed.

Figure 13:
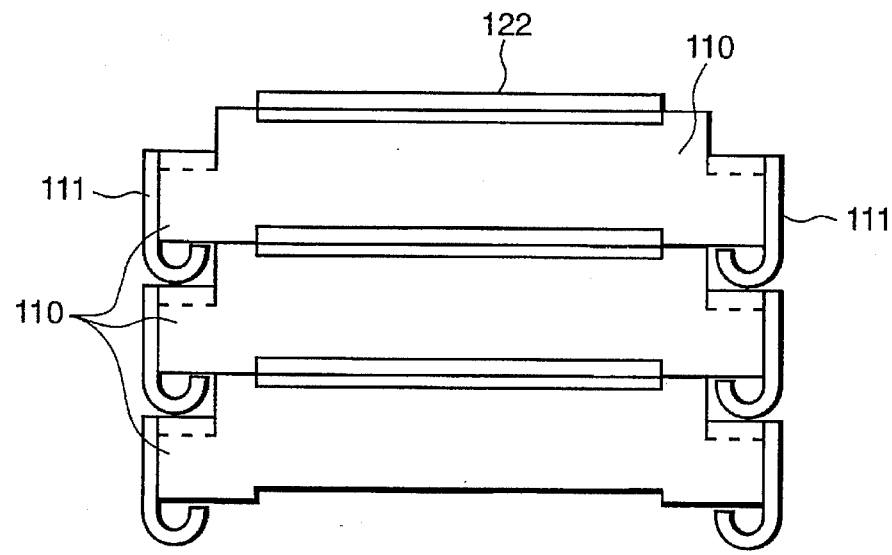
FIG. 13 is a schematic sectional view of a stacked module using semiconductor assemblies on which the heat sink shown in FIG. 11B is mounted.

The widths of the top and bottom recess portions 112 and 113 are generally the same, so that a heat sink 121 of FIG. 11A or a heat sink 122 of FIG. 11B can be accommodated within a space 124 collectively defined by the recessed portions 112 and 113 as shown in FIG. 12 or FIG. 13. The shape of the heat sink may be varied with the topology of the space 124 defined by the top and bottom recessed portions when the assemblies are stacked, and as required structural efficiency for the heat emission performance of itself. The thickness of the heat sink 121 or 122 is taken along with the thickness of the assembly body.

A thicker SOJ package needs a thicker heat sink, and a TSOJ package can employ a thicker heat sink compared to a thin assembly body. In the TSOJ configuration, as an example, it is preferable to make the heat sink about 0.2 mm (=8 mil) thick, versus a depth of the top and bottom recess portions 112 or 113 of about 0.1 mm, respectively.

In FIG. 12 or FIG. 13, the heat sink 121 or 122 may be attached to the bottom recess portion of an upper assembly and the top recess portion of a lower assembly, by means of an epoxy material having thermal conductivity, such as Ag, or metal impurities, for example.

Figure 14:
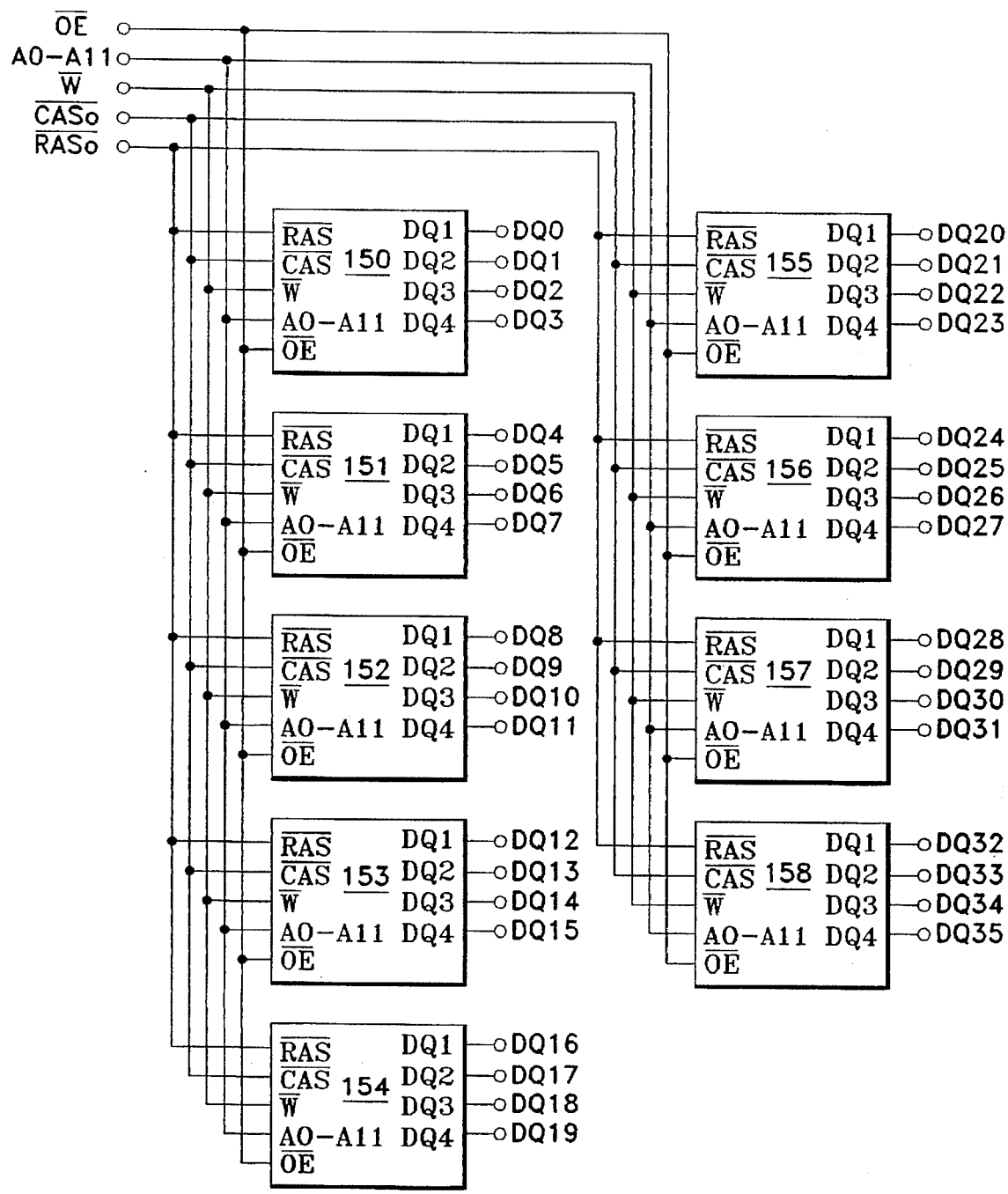
FIG. 14 is a functional block diagram illustrating electrical interconnection of a stacked module according to the present invention.

FIG. 14 shows a conventional electrical interconnection diagram of a module in which nine 16 Mb DRAM integrated circuits 150 to 158 are stacked in accordance with one of the embodiments aforementioned. Each of the integrated circuits 150 to 158 has four data pins DQ0 to DQ3, DQ4 to DQ7, DQ8 to DQ11, DQ12 to DQ15, DQ16 to DQ19, DQ20 to DQ23, DQ24 to DQ27, DQ28 to DQ31, and DQ32 to DQ35, respectively. Other signal pins such as address pins A0 to A11, output enable signal pins OE, write control signal pins W, column address strobe signal pins CAS and row address strobe signal pins RAS are also commonly used. The number of data pins is proportional to the number of integrated circuits to be stacked within the module.

Figure 15:
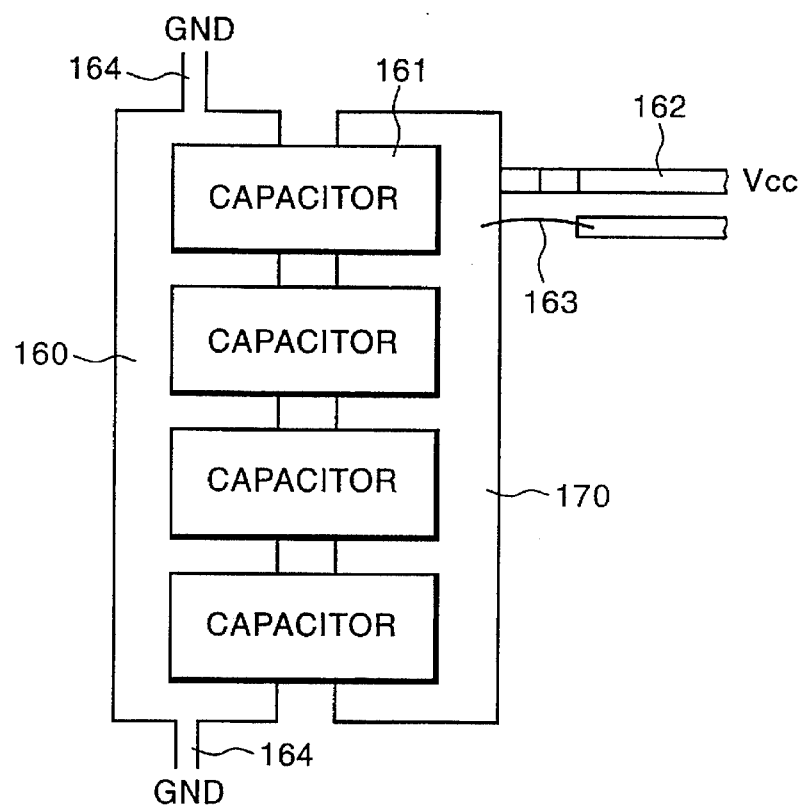
FIG. 15 is a plan view of a semiconductor assembly employing capacitor elements mounted on a die pad, according to the present invention.
Figure 16:
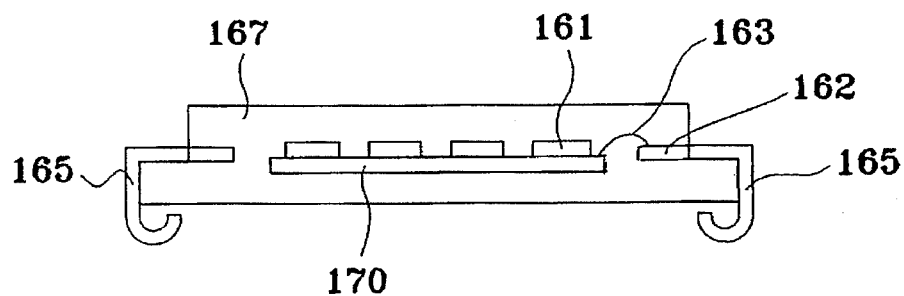
FIG. 16 is a vertical sectional view of the semiconductor assembly corresponding to that shown in FIG. 15.

FIGS. 15 and 16 show configurations of a semiconductor assembly employing capacitor elements for securing electrical stability of input and output data. Capacitors 161 are attached to die pads 160 and 170 in parallel. One of the die pads 160 is used as a ground voltage (GND) plate and the other die pad 170 is connected to a power supply voltage terminal Vcc through two inner leads 162. If the capacitance of one capacitor is 0.1 μF, the total capacitance of the four capacitors represented in FIG. 15 or FIG. 16 becomes 0.4 μF which can be adapted to the module with 16 Mb DRAM shown in FIG. 14.

In order to electrically connect the die pad 170 and the inner leads 162, bonding wires 163 are provided, or the die pad 170 and the Vcc terminal are otherwise suitably connected therebetween.

Though, as illustrated in FIG. 16, the overall package configuration of the capacitor assembly is the same as that of the assembly shown in FIG. 6, any of the previously described package types may be used so as to be stacked together.

Figure 17:
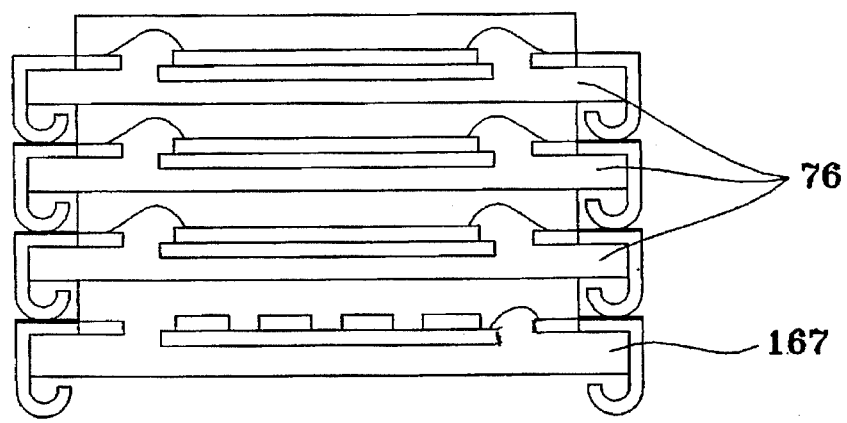
FIG. 17 is a sectional view of a stacked module using the semiconductor assemblies shown in FIG. 6 and FIG. 16.

Referring to FIG. 17, the capacitor assembly 167 of FIG. 16 is laid on the lowest side of the module and integrated circuit assemblies 76 are stacked thereon in turn. The fabricating and attaching methods are the same as described above.

Figure 18A:
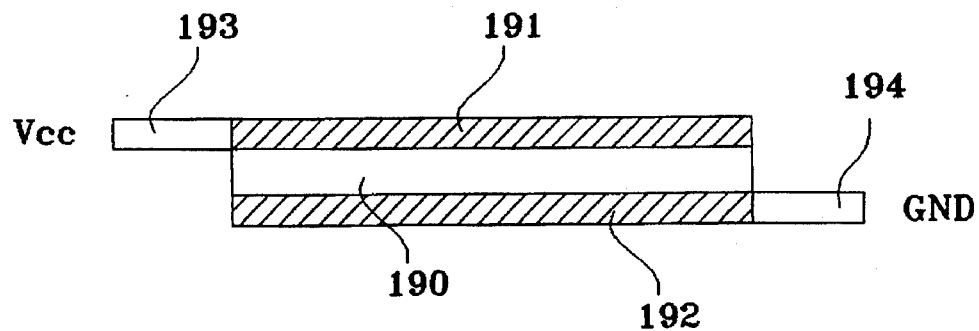
FIG. 18A is a schematic sectional view of a capacitor plate which may be employed in the semiconductor assembly shown in FIG. 10.
Figure 18B:
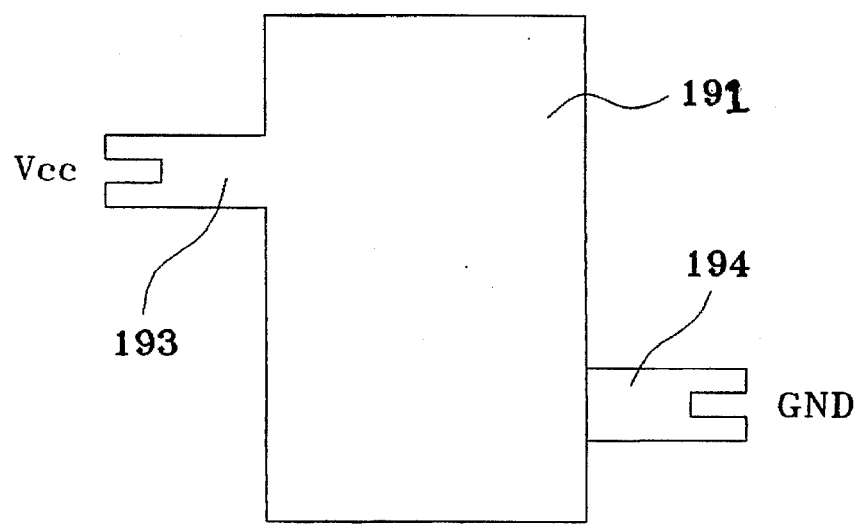
FIG. 18B is a plan view of the capacitor plate shown in FIG. 18A.

The present invention also can employ a capacitor plate as shown in FIGS. 18A and 18B, instead of the capacitor assembly 167 of FIGS. 15 and 16. Referring to FIGS. 18A and 18B, two metallic foil sheets 191 and 192 are respectively attached to a top surface and a bottom surface of insulation plate 190. The metal foil sheet 191 on the top surface of the insulation plate 190 is connected to a power supply voltage Vcc through lead 193 and the metal foil sheet 192 on the bottom surface of the insulation plate 190 is connected to a ground voltage GND through lead 194. The capacitor plate shown in FIGS. 18A and 18B can be mounted on an integrated circuit assembly without increasing the overall height of a module.

Figure 19:
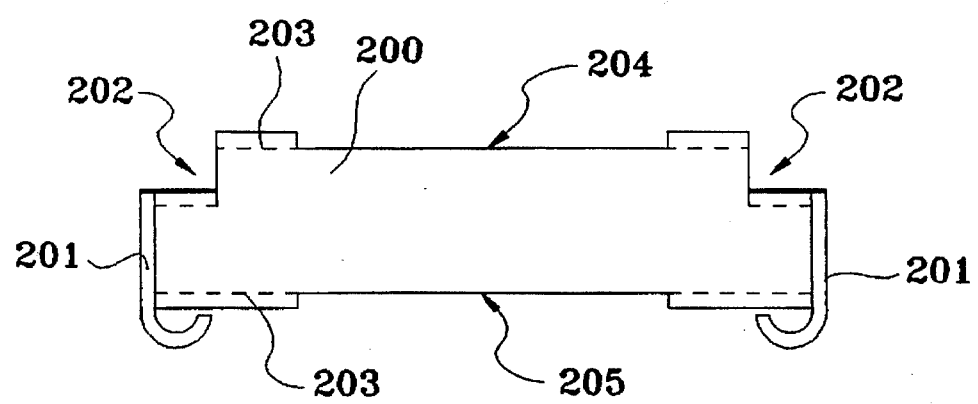
FIG. 19 is a front elevation view of a semiconductor assembly employing the capacitor plate shown in FIG. 18B.

FIG. 19 shows a preferable configuration of an integrated circuit assembly adapted to use the capacitor plate shown in FIGS. 18A and 18B. In FIG. 19, the assembly has the same general structure as the assembly shown in FIG. 10, except that metal foil traces 203 are formed on top and bottom surfaces of assembly body 200 in order to accommodate the leads 193 and 194 of the capacitor plate. The thickness of the traces 203 is the same as those of recess portions 204 and 205. It should be noted that when the assemblies of FIG. 19, each accommodating the capacitor plates, have been completely stacked, the capacitor plate is disposed in a space defined by the bottom recess portion 205 of an upper assembly and the top recess portion 204 of a lower assembly. An increase in overall height of the stacked module due to the capacitor plate therefore does not occur.

It will be appreciated from the foregoing that the present invention represents a significant advantage over the prior art. In particular, the present invention provides a variety of novel constructions useful for a high density and reliable three-dimensional integrated circuit package, widely adaptable to alternative usages. The novel construction also needs no additional increase of the size in employing a plurality of heat sinks or capacitor devices to the three-dimensional package.

Even more importantly, the novel construction of the assembly according to the present invention allows for low cost manufacture because new-found process steps are not necessary to form a three-dimensional integrated circuit package.

It will be also appreciated that, although specific embodiments of the present invention have been described in detail for purposes of illustration, various modifications may be made without departing from the spirit and scope of the present invention as disclosed and claimed herein.

What is claimed is:

1. A semiconductor chip package which is stackable, in a stacking height direction, with at least one like semiconductor chip package for providing a stacked semiconductor chip package module on a printed circuit board, comprising:

a semiconductor chip package body having at least two edges which oppose one another in a lateral direction relative to said stacking height direction as a respective pair;

said body having two opposite faces relative to said stacking height direction;

each edge of at least one pair of said edges of said body being provided with a plurality of recesses which are spaced from one another along the respective edge and which open through one of said faces of said body; and a plurality of leads each of which is electrically connected to said semiconductor chip; said leads being arranged in sets, each corresponding to a said recess of a said edge of a said pair of edges of said body; each lead having a first portion which is located within a respective corresponding said recess so as to be exposed through said one of said faces of said body; each lead further having a second portion which extends from the respective said first portion, out of the respective said recess, and to a respective location in which said second portion is disposed for electrically contacting a first portion of a corresponding lead of a like package or a corresponding lead of a printed circuit board, upon stacking of said body in said stacking direction.

2. The semiconductor chip package of claim 1, wherein:

each said lead first portion and second portion substantially corresponds in width to the width, along the respective said edge, of the respective said recess in which the first portion of the respective said lead is located.

3. The semiconductor chip package of claim 1, wherein: said body has four said edges arranged in two said pairs.

4. The semiconductor chip package of claim 1, wherein:

each recess is less deep than said body is thick so as to have a floor, each said lead first portion being supported by a respective said floor.

5. The semiconductor chip package of claim 1, wherein:

said body further includes a respective central recess provided in each of said faces thereof, each for cooperating with respective opposite central recess of a respective like chip to receive a respective heat sink.

6. The semiconductor chip package of claim 1, wherein: each said lead second portion is J-shaped.

7. A stacked semiconductor chip package module for mounting on a printed circuit board having a pattern of leads, said module comprising:

a plurality of like semiconductor chip packages stacked in a stack on one another in a stacking height direction, including one semiconductor chip package arranged to be disposed closest to the printed circuit board, and another semiconductor chip package stacked on said one semiconductor chip package;

each said semiconductor chip package comprising:

a semiconductor chip package body having an at least two edges which oppose one another in a lateral direction relative to said stacking height direction as a respective pair;

said body having two opposite faces relative to said stacking height direction;

each edge of at least one pair of said edges of said body being provided with a plurality of recesses which are spaced from one another along the respective edge and which open through one of said faces of said body; and a plurality of leads each of which is electrically connected to said semiconductor chip; said leads being arranged in sets, each corresponding to a said recess of a said edge of a said pair of edges of said body; each lead having a first portion which is located within a respective corresponding said recess so as to be exposed through said one of said faces of said body; each lead further having a second portion which extends from the respective said first portion, out of the respective said recess, and to a respective location in which said second portion electrically contacts a first portion of a corresponding lead of a like package or is disposed for contacting a corresponding lead of the printed circuit board.

8. The stacked semiconductor chip package module of claim 7, wherein:

each said body further includes a respective central recess provided in each of said faces thereof;

at least two opposed ones of said central recesses, of correspondingly adjacent ones of said packages of said stack cooperatively defining a space.

9. The stacked semiconductor chip package module of claim 8, further including:

a respective heat sink received in at least one said space.

10. The stacked semiconductor chip package module of claim 8, further including:

a respective capacitor received in at least one said space.

11. The stacked semiconductor chip package module of claim 10, wherein:

each said capacitor includes:

a first die pad at ground voltage level;

a second die pad at power supply voltage level;

a plurality of capacitative elements connected in parallel across said first and second die pads;

a capacitor assembly body formed around said first and second die pads and said plurality of capacitative elements; and a plurality of capacitator leads electrically respectively connected to said first and second die pads and extending out of said capacitor assembly body, so as to have respective extending portions; and said respective extending portions of said capacitator leads extending between and being electrically connected with respective first and second portions of respective leads of respective adjacent ones of said packages in said stack.

12. The stacked semiconductor chip package module of claim 7, wherein:

each said lead second portion is J-shaped.

* * * * *